United States Patent
Yu

(10) Patent No.: US 6,787,424 B1
(45) Date of Patent: Sep. 7, 2004

(54) FULLY DEPLETED SOI TRANSISTOR WITH ELEVATED SOURCE AND DRAIN

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/780,043

(22) Filed: Feb. 9, 2001

(51) Int. Cl.[7] .............................................. H01L 21/336

(52) U.S. Cl. ..................... 438/300; 438/486; 257/E21; 257/431

(58) Field of Search ................................ 438/300, 486, 438/FOR 197; 257/E21.431

(56) References Cited

U.S. PATENT DOCUMENTS

| | | |
|---|---|---|
| 4,532,695 A | 8/1985 | Schuermeyer |
| 4,683,645 A | 8/1987 | Naguib et al. |
| 4,745,082 A | 5/1988 | Kwok |
| 4,784,718 A | 11/1988 | Mitani et al. |
| 4,789,644 A * | 12/1988 | Meda ......................... 438/300 |
| 4,835,112 A | 5/1989 | Pfiester et al. |
| 4,954,867 A | 9/1990 | Hosaka |
| 4,998,150 A | 3/1991 | Rodder et al. ............. 357/23.1 |
| 5,102,816 A | 4/1992 | Manukonda et al. ......... 437/44 |
| 5,108,954 A | 4/1992 | Sandhu et al. |
| 5,168,072 A | 12/1992 | Moslehi ....................... 437/41 |
| 5,200,352 A | 4/1993 | Pfiester ........................ 437/44 |
| 5,258,637 A | 11/1993 | Sandhu et al. |
| 5,264,382 A | 11/1993 | Watanabe |
| 5,320,974 A | 6/1994 | Hori et al. .................... 437/44 |
| 5,374,575 A | 12/1994 | Kim et al. |
| 5,391,510 A | 2/1995 | Hsu et al. |
| 5,393,685 A | 2/1995 | Yoo et al. |
| 5,429,956 A | 7/1995 | Shell et al. |
| 5,491,099 A | 2/1996 | Hsu |
| 5,516,707 A | 5/1996 | Loh et al. |
| 5,593,907 A | 1/1997 | Anjum et al. |
| 5,595,919 A | 1/1997 | Pan |
| 5,607,884 A | 3/1997 | Byun |
| 5,654,570 A | 8/1997 | Agnello |
| 5,675,159 A | 10/1997 | Oku et al. |
| 5,716,861 A | 2/1998 | Moslehi |
| 5,733,792 A | 3/1998 | Masuoka ....................... 437/35 |
| 5,736,446 A | 4/1998 | Wu |
| 5,753,542 A | 5/1998 | Yamazaki et al. .......... 438/162 |
| 5,789,792 A | 8/1998 | Tsutsumi ..................... 257/506 |
| 5,793,090 A | 8/1998 | Gardner et al. |
| 5,811,323 A | 9/1998 | Miyasaka et al. |
| 5,825,066 A | 10/1998 | Buynoski |

(List continued on next page.)

FOREIGN PATENT DOCUMENTS

| | | |
|---|---|---|
| JP | 3-248433 | 11/1991 |
| JP | 4-123439 | 4/1992 |
| JP | 5-160396 | 6/1993 |
| JP | 5-206454 | 8/1993 |
| JP | 8-17845 | 1/1996 |
| JP | 11-102907 | 4/1999 |

OTHER PUBLICATIONS

"Sub 50–nm FinFET: PMOS" Huang, et al. Department of Electrical Engineering and Computer Sciences, University of California at Berkley, 1999, IEEE.

(List continued on next page.)

*Primary Examiner*—George Fourson
(74) *Attorney, Agent, or Firm*—Foley & Lardner LLP

(57) ABSTRACT

A method of manufacturing an integrated circuit utilizes a thin film substrate. The method includes providing a mask structure on a top surface of the thin film, depositing a semiconductor material above the top surface of the thin film and the mask structure, removing the semiconductor material to a level below the top surface of the mask structure, siliciding the semiconductor material, and providing a gate structure in an aperture formed by removing the mask structure. The transistor can be a fully depleted transistor having material for siliciding source and drain regions.

20 Claims, 4 Drawing Sheets

U.S. PATENT DOCUMENTS

| | | | |
|---|---|---|---|
| 5,851,869 A | 12/1998 | Urayama | |
| 5,856,225 A | 1/1999 | Lee et al. | |
| 5,858,843 A | 1/1999 | Doyle et al. | |
| 5,888,888 A | 3/1999 | Talwar et al. | |
| 5,908,307 A | 6/1999 | Talwar et al. | |
| 5,915,182 A | 6/1999 | Wu | |
| 5,915,196 A | 6/1999 | Mineji | |
| 5,949,105 A | 9/1999 | Moslehi | 257/336 |
| 5,953,616 A | 9/1999 | Ahn | |
| 5,960,270 A | 9/1999 | Misra et al. | 438/197 |
| 5,985,726 A | 11/1999 | Yu et al. | |
| 6,008,111 A | 12/1999 | Fushida et al. | |
| 6,017,808 A | 1/2000 | Wang et al. | |
| 6,025,254 A | 2/2000 | Doyle et al. | 438/592 |
| 6,030,863 A | 2/2000 | Chang et al. | |
| 6,033,958 A | 3/2000 | Chou et al. | 438/275 |
| 6,037,204 A | 3/2000 | Chang et al. | |
| 6,051,473 A | 4/2000 | Ishida et al. | 438/23.1 |
| 6,057,200 A | 5/2000 | Prall et al. | 438/300 |
| 6,072,222 A | 6/2000 | Nistler | |
| 6,080,645 A | 6/2000 | Pan | |
| 6,083,798 A * | 7/2000 | Lin | 438/297 |
| 6,087,235 A | 7/2000 | Yu | |
| 6,090,691 A | 7/2000 | Ang et al. | 438/564 |
| 6,096,614 A | 8/2000 | Wu | |
| 6,100,787 A | 8/2000 | Chan et al. | |
| 6,103,609 A | 8/2000 | Lee et al. | |
| 6,110,783 A | 8/2000 | Burr | |
| 6,110,787 A | 8/2000 | Chan et al. | 438/300 |
| 6,124,176 A | 9/2000 | Togo | 438/305 |
| 6,137,149 A | 10/2000 | Kodama | |
| 6,150,221 A | 11/2000 | Aoyama | |
| 6,156,613 A | 12/2000 | Wu | |
| 6,171,910 B1 | 1/2001 | Hobbs et al. | 438/275 |
| 6,177,323 B1 * | 1/2001 | Wu | 438/300 |
| 6,184,097 B1 | 2/2001 | Yu | |
| 6,187,642 B1 | 2/2001 | Yu et al. | |
| 6,190,977 B1 | 2/2001 | Wu | |
| 6,194,748 B1 | 2/2001 | Yu | 257/216 |
| 6,200,867 B1 | 3/2001 | Chenphv | |
| 6,211,026 B1 | 4/2001 | Ahmad et al. | 438/300 |
| 6,216,357 B1 | 4/2001 | Victor et al. | 33/810 |
| 6,228,722 B1 | 5/2001 | Lu | 438/279 |
| 6,248,637 B1 | 6/2001 | Yu | 438/300 |
| 6,297,109 B1 | 10/2001 | Chan et al. | 438/300 |
| 6,300,201 B1 | 10/2001 | Shao et al. | 438/281 |
| 6,300,203 B1 | 10/2001 | Buynoski et al. | 438/287 |
| 6,316,357 B1 | 11/2001 | Lin et al. | 438/662 |
| 6,365,474 B1 | 4/2002 | Finder et al. | 438/305 |
| 6,380,043 B1 * | 4/2002 | Yu | 438/300 |
| 6,406,963 B2 * | 6/2002 | Woerlee et al. | 438/291 |
| 6,482,705 B1 * | 11/2002 | Yu | 438/300 |
| 6,531,380 B2 * | 3/2003 | Li et al. | 438/579 |
| 6,541,327 B1 * | 4/2003 | Chan et al. | 438/229 |
| 6,551,885 B1 * | 4/2003 | Yu | 438/300 |
| 6,551,886 B1 * | 4/2003 | Yu | 438/300 |
| 2002/0027255 A1 * | 3/2002 | Iwata et al. | 257/385 |
| 2002/0072181 A1 * | 6/2002 | Tseng | 438/300 |
| 2002/0192914 A1 * | 12/2002 | Kizilyalli et al. | 438/300 |

OTHER PUBLICATIONS

"Ultra–Thin–Body Silicon–On–Insulator MOSFET's for Terabit–Scale Integration" Yu, et al., Department of Electrical Engineering & Computer Sciences.

"Sub–100nm Gate Length Metal Gate NMOS Transistors Fabricated by a Replacement Gate Process", Chatterjee, et al., International Electronic Devices Meeting, Dec. 7–10, 1997.

"Silicon Processing for the VLSI Era, vol. 1: Process Technology", Wolf, et al., Lattice Press, pp 296–308.

"Silicon Processing for the VLSI Era, vol. 2: Process Integration" Wolf, et al., Lattice Press, pp 66, 67, 72, 73, 154, 155, 157, 158.

"Recrystallization of Implanted Amorphous Silicon Layers. I. Electrical Properties of Silicon Implanted with BF+2 or Si+ + B+a)" by Tsai, et al. Journal of Applied Physics, vol. 50, No. 1, Jan. 1979.

U.S. patent application Ser. No. 09/779,985 filed Feb. 9, 2001 "A Replacement Gate Process for Transistors having Elevated Source and Drain" (Atty Dkt No. 39153/407).

U.S. patent application Ser. No. 09/779,985 filed Feb. 9, 2001 "A Low Temperature Process to Locally Form High–K Gate Dielectrics" (Atty Dkt No. 39153/409).

U.S. patent application Ser. No. 09/779,987 filed Feb. 9, 2001 "A Process for Manufacturing MOS Transistors Having Elevated Source and Drain" (Atty Dkt No. 39153/412).

U.S. patent application Ser. No. 09/779,986 filed Feb. 9, 2001 "A Low Temperature Process for a Thin Film Transistor" (Atty Dkt No. 39153/413.

U.S. patent application Ser. No. 09/405,831 filed Sep. 24, 1999 "Process for Manufacturing MOS Transistors Having Elevated Source and Drain" (Atty Dkt. No. 39153/219).

U.S. patent application Ser. No. 09/779,988 filed Feb. 9, 2001 "A Low–Temperature Process for a Thin Film Transistor" (Atty Dkt No. 39153/417).

U.S. patent application Ser. No. 09/609,613 filed Jul. 5, 2000 "Low Thermal Budget Process for Manufacturing MOS Transistors having Elevated Source and Drain Regions" (Atty Dkt No. 39153/269).

U.S. patent application Ser. No. 09/255,546 filed Feb. 22, 1999 "Locally Confined Deep Pocket Process for USLI MOSFETS" (Atty Dkt No. 39153/133).

U.S. patent application Ser. No. 09/397,217 filed Sep. 16, 1999 "Source/Drain Doping Technique for Ultra–Thin Body SOI MOS" (Atty Dkt No. 39153/203).

* cited by examiner

FULLY DEPLETED SOI TRANSISTOR WITH ELEVATED SOURCE AND DRAIN

CROSS-REFERENCE TO RELATED APPLICATIONS

This patent application is related to U.S. application Ser. No. 09/405,831, now issued U.S. Pat. No. 6,248,637, filed on Sep. 24, 1999, by Yu, entitled "A Process for Manufacturing MOS Transistors Having Elevated Source and Drain Regions," U.S. application Ser. No. 09/397,217, filed on Sep. 16, 1999, by Yu et al., now issued U.S. Pat. No. 6,403,433, entitled "Source/Drain Doping Technique for Ultra-Thin-Body SOI MOS Transistors," and U.S. application Ser. No. 09/384,121, filed on Aug. 27, 1999, by Yu, now issued U.S. Pat. No. 6,265,293, entitled "CMOS Transistors Fabricated in Optimized RTA Scheme." This patent application is also related to U.S. application Ser. No. 09/609,613, filed on Jul. 5, 2000 herewith by Yu entitled, now issued U.S. Pat. No. 6,399,450, "A Process for Manufacturing MOS Transistors having Elevated Source and Drain Regions". This patent application is also related to U.S. Pat. application Ser. No. 09/781,039, filed on an even date herewith by Yu, entitled "Low Temperature Process to Locally Form High-K Gate Dielectrics," U.S. Pat. application Ser. No. 09/779,985, filed on an even date herewith by Yu, entitled "Replacement Gate Process for Transistor Having Elevated Source and Drain," U.S. Pat. application Ser. No. 09/779,986, filed on an even date herewith by Yu, entitled "A Low Temperature Process For a Thin Film Transistor," U.S. Pat. application Ser. No. 09/779,988, filed on an even date herewith by Yu, entitled "Low Temperature Process for Transistors with Elevated Source and Drain," and U.S. Pat. application Ser. No. 09/779,987, now issued U.S. Pat. No. 6,403,434, filed on an even date herewith by Yu, entitled "A Process for Manufacturing MOS Transistors Having Elevated Source and Drain Regions and a High-K Gate Dielectric." All of the above patent applications are assigned to the assignee of the present application.

FIELD OF THE INVENTION

The present specification relates to integrated circuits (ICs) and methods of manufacturing integrated circuits. More particularly, the present application relates to a method of manufacturing integrated circuits having thin film transistors.

BACKGROUND OF THE INVENTION

Currently, deep-submicron complementary metal oxide semiconductor (CMOS) is the primary technology for ultra-large scale integrated (ULSI) devices. Over the last two decades, reducing the size of CMOS transistors and increasing transistor density on ICs has been a principal focus of the microelectronics industry. An ultra-large scale integrated circuit can include over 1 million transistors. Transistors, such as, metal oxide semiconductor field effect transistors (MOSFETs), are generally bulk semiconductor-type devices or silicon-on-insulator (SOI)-type devices.

In bulk semiconductor-type devices, transistors, such as, MOSFETs are built on the top surface of a bulk substrate. The substrate is doped to form source and drain regions, and a conductive layer is provided on the top surface between the source and drain regions. The conductive layer operates as a gate for the transistor; the gate controls current in a channel between the source and the drain regions. As transistors become smaller, the body thickness of the transistor (and thickness of the depletion layer below the inversion channel) must be scaled down to achieve superior short channel performance.

According to conventional complimentary metal oxide semiconductor (CMOS) fabrication techniques, the reduction of the depletion layer thickness is realized by a super-steep retrograded well (SSRW) ion implantation process. However, this process is limited by the diffusion of dopant atoms during subsequent thermal processes (e.g., annealing). The ion implantation process can generally only achieve an 80-nanometer or larger body thickness for a transistor. Thus, conventional fabrication techniques for bulk semiconductor type-devices cannot create transistors with a body thickness less than 80 nm.

Accordingly, bulk semiconductor-type devices can be subject to disadvantageous properties due to the relatively large body thicknesses. These disadvantageous properties include less than ideal sub-threshold voltage rolloff, short channel effects, and drain induced barrier lowering. Further still, bulk semiconductor-type devices can be subject to further disadvantageous properties such as high junction capacitance, ineffective isolation, and low saturation current. These properties are accentuated as transistors become smaller and transistor density increases on ICs.

The ULSI circuit can include CMOS field effect transistors (FETS) which have semiconductor gates disposed between drain and source regions. The drain and source regions are typically heavily doped with a P-type dopant (boron) or an N-type dopant (phosphorous).

The source and drain regions are often silicided to reduce source/drain series resistance or contact resistance. However, as body thickness is reduced, the amount of material available for silicidation is reduced. Accordingly, large source/drain series resistance remains a considerable factor adversely affecting device performance.

The source and drain regions can be raised by selective silicon (Si) epitaxy to make connections to source and drain contacts less difficult. The raised source and drain regions provide additional material for contact silicidation processes and thereby reduce deep source/drain junction resistance and source/drain series resistance. However, the epitaxy process that forms the raised source and drain regions generally requires high temperatures exceeding 1000° C. (e.g., 1100–1200° C.). These high temperatures increase the thermal budget of the process and can adversely affect the formation of steep retrograde well regions and ultra shallow source/drain extensions.

The high temperatures, often referred to as a high thermal budget, can produce significant thermal diffusion which can cause shorts between the source and drain region (between the source/drain extensions). The potential for shorting between the source and drain region increases as gate lengths decrease.

Conventional SOI-type devices include an insulative substrate attached to a thin film semiconductor substrate which contains transistors similar to the MOSFET described with respect to bulk semiconductor-type devices. The transistors have superior performance characteristics due to the thin film nature of the semiconductor substrate and the insulative properties of the insulative substrate (e.g., the floating body effect). The superior performance is manifested in superior short channel performance (i.e., resistance to process variation in small size transistor), near-ideal subthreshold voltage swing (i.e., good for low off-state current leakage), and high saturation current.

As transistors become smaller, the thin film semiconductor substrate also becomes thinner. The thinness of the thin film semiconductor substrate prevents effective silicidation on the thin film semiconductor substrate. Effective silicidation is necessary to form source and drain contacts. Without effective silicidation, the transistor can have large source/drain series resistances.

Typically, silicidation must consume a certain volume of the semiconductor substrate (e.g., silicon), which is not abundantly available on the thin film semiconductor substrate. The significant volume of the substrate must be consumed to appropriately make electrical contact to the source and drain regions. Accordingly, SOI-type devices are susceptible to the high series source/drain resistance which can degrade transistor saturation current and hence, the speed of the transistor. The high series resistance associated with conventional SOI CMOS technology is a major obstacle which prevents SOI technology from becoming a mainstream IC technology.

Thus, there is a need for a method of manufacturing thin film, fully depleted MOSFET ICs which has advantages over conventional bulk type devices. Further still, there is a need for a method of manufacturing a transistor which has superior short-channel performance, near ideal subthreshold swing, and high saturation current and yet is not susceptible to high series resistance and tunnel leakage current. Even further still, there is a need for a process for making a thin film transistor which has sufficient silicon for effective silicidation and includes a high-k gate dielectric. Yet further, there is a need for a fully depleted, thin film transistor with elevated source and drain regions and high-k gate dielectrics manufactured in an optimized annealing process. Yet even further, there is a need for a process flow of forming elevated source and drain regions on an SOI-substrate before forming a high-k gate dielectric.

SUMMARY OF THE INVENTION

An exemplary embodiment relates to a method of manufacturing an integrated circuit. The integrated circuit includes a thin film transistor on a substrate. A substrate includes a thin semiconductor layer. The method includes steps of providing a sacrificial gate structure on the thin film semiconductor layer of the substrate, etching the substrate in accordance with the sacrificial gate structure, providing an amorphous semiconductor layer above the substrate and over the gate structure, removing a portion of the amorphous semiconductor layer to expose the gate structure, and forming a single crystalline material from the amorphous semiconductor material. The method also includes steps of siliciding the single crystalline material, removing the sacrificial gate structure to form an aperture, and providing a gate conductor in the aperture.

Another exemplary embodiment relates to a method of manufacturing an ultra-large scale integrated circuit including a transistor. The method includes providing a mask structure on a top surface of a thin film, depositing a semiconductor material above the top surface of the thin film and the mask structure, removing the semiconductor material to a level below a top surface of the mask structure, siliciding the semiconductor material, removing the mask structure to leave an aperture, and providing a gate conductor in the aperture.

Yet another exemplary embodiment relates to a transistor including a thin film, a gate structure, source and drain regions, and a silicide layer. The gate structure includes a gate dielectric above the thin film and a gate conductor above a portion of the gate dielectric. The source and drain regions are adjacent to the gate structure. The silicide layer has a top surface above a bottom surface of the gate conductor and below a top surface of the gate conductor. The gate dielectric is at least partially above the top surface of the silicide layer.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
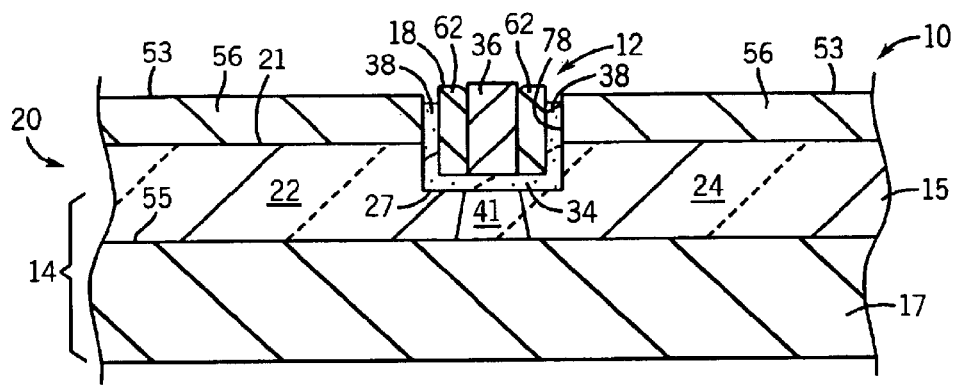
FIG. 1 is a schematic cross-sectional view of a portion of an integrated circuit in accordance with an exemplary embodiment of the present invention, the portion including a thin film transistor.

With reference to FIG. 1, a portion 10 of an integrated circuit (IC) includes a transistor 12 which is disposed on a semiconductor substrate 14, such as, a wafer. Semiconductor substrate 14 is preferably a semiconductor-on-insulator (SOI) substrate (e.g., a silicon-on-glass substrate). Alternatively, substrate 14 can be any type of IC substrate including gallium arsenide (GaAs), germanium, or a bulk P-type silicon substrate.

Substrate 14 preferably includes a thin or ultra-thin semiconductor layer 15 and a thick insulative layer 17. Insulative layer 17 can be a 500–2000 Å thick silicon dioxide material. Semiconductor layer 15 can be a 5–20 nanometer thick single crystal silicon film. Alternatively, a film or layer 15 can include other semiconductor materials, such as, germanium, and can be amorphous or polycrystalline. Preferably, layer 15 is crystalline so it can act as a seed layer in a subsequent solid phase epitaxy process step.

Transistor 12 is preferably a thin film, fully-depleted (FD) SOI MOSFET having a raised source/drain structure 20. Transistor 12 can be formed on an island of a silicon thin film (e.g., layer 15). Raised source/drain structure 20 provides more room for thick silicidation layers, such as, a silicide layer 56. Silicide layer 56 advantageously reduces source/drain series resistance. Transistor 12 can be embodied as a P-channel or N-channel metal oxide semiconductor field effect transistor (MOSFET) and is described below as an N-channel transistor.

Transistor 12 includes a gate structure 18, an elevated source region 22, and an elevated drain region 24. Regions 22 and 24 extend from a top surface 21 (above a top surface 27 of substrate 14) to a bottom 55 in substrate 14. Regions 22 and 24 are 800–2000 Å deep (from surface 21 to bottom 55).

Regions 22 and 24 can include a source extension, a drain extension, a deep source region, and a deep drain region. For an N-channel transistor, regions 22 and 24 are heavily doped with N-type dopants (e.g., $5\times10^{19}$–$1\times10^{20}$ dopants per cubic centimeter). For a P-channel transistor, regions 22 and 24 are heavily doped with P-type dopants (e.g., $5\times10^{19}$–$1\times10^{20}$ dopants per cubic centimeter). An appropriate dopant for a P-channel transistor is boron, boron diflouride, or iridium, and an appropriate dopant for an N-type transistor is arsenic, phosphorous, or antimony.

Gate stack or structure 18 includes a gate dielectric layer 34 and a gate conductor 36. Structure 18 is disposed in an aperture 78. Aperture 78 is preferably 800–2000 Å deep and 500–2000 Å wide. A channel region 41 underneath gate structure 18 separates regions 22 and 24. Region 41 can be doped in a variety of fashions according to transistor specifications and operating parameters.

Dielectric layer 34 can be comprised of an insulative material, such as silicon dioxide or silicon nitride. Preferably, layer 34 is a 50–200 Å thick layer of silicon dioxide.

Alternatively, layer 34 can be a 5–20 nm thick conformal layer of tantalum pentaoxide ($Ta_2O_5$), aluminum oxide ($Al_2O_3$), titanium dioxide ($TiO_2$), silicon nitride ($SiN_3$) or other material having a dielectric constant (k) over or at least 8.

In a preferred embodiment, dielectric layer 34 can be deposited by CVD as silicon nitride over substrate 14. Layer 34 is U-shaped in cross-section and has a bottom surface coplanar with top surface 27 of substrate 14 at its lowest point. Layer 34 also includes portions 38 above regions 22 and 24.

Gate conductor 36 is disposed above layer 34 within aperture 78. Conductor 36 can be 800–2000 Å thick and 800–2000 Å wide. Conductor 36 is preferably a layer of conductive material. Gate conductor 36 is preferably a metal, such as titanium nitride (TiN), tungsten (W), molybdenum (Mo), etc. Alternatively, conductor 36 can be polysilicon or polysilicon/germanium.

Gate structure 18 can also include oxide liners or spacers 62. Spacers 62 abut sidewalls of gate conductor 36. Spacers 62 are disposed within aperture 78 and between layer 34 and sidewalls of conductor 36. Spacers 62 are preferably silicon nitride ($Si_3N_4$) having a width of 200–500 Å and a thickness (height) of 800–2000 Å. Spacers 62 can be other insulative materials, such as, silicon dioxide.

Silicide layer 56 is disposed on top of source region 22 and drain region 24 (e.g., adjacent aperture 78). Preferably, layer 56 is a cobalt silicide ($CoSi_x$). Alternatively, layer 56 can be any type of refractory metal and silicon combination, such as, a nickel silicide, tungsten silicide, titanium or other silicide material. Preferably, layer 56 is 300–600 Å thick.

An insulative layer can be disposed above layer 56. Contacts can be coupled to layer 56 through the insulative layer to connect regions 22 and 24 to conductive lines.

With reference to FIGS. 1–10, the fabrication of a thin film, fully depleted transistor 12, including elevated source region 22 and elevated drain region 24, is described as follows. The advantageous process allows silicide layer 56 above source and drain regions 22 and 24 to be formed without adversely affecting doping characteristics of transistor 12.

Figure 2:
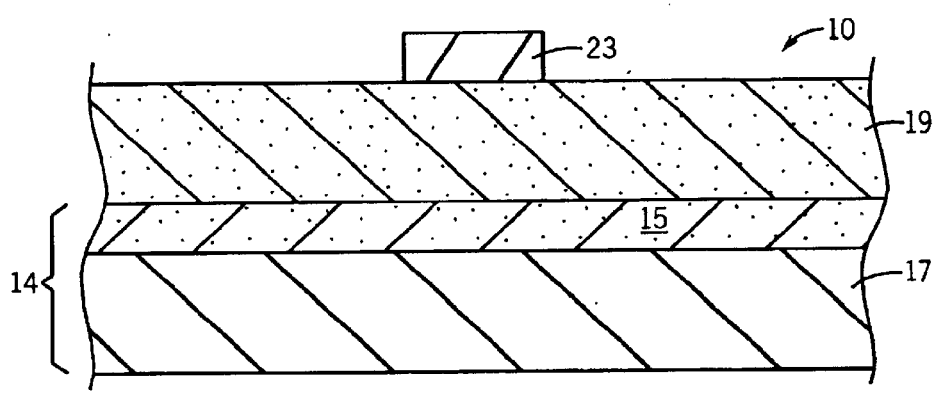
FIG. 2 is a schematic cross-sectional view of the portion of the integrated circuit illustrated in FIG. 1, showing a lithographic patterning step.

With reference to FIG. 2, substrate 14 is embodied as an SOI substrate including a layer 15 above a layer 17. Layer 15 can be a 5–20 nanometer silicon film above a silicon dioxide material, such as layer 17. Substrate 14 can be a conventional SOI substrate available from wafer manufacturers. Layer 15 can be doped for appropriate channel characteristics.

A sacrificial or mask layer 19 is provided above layer 15. Preferably, layer 19 is a 100–200 nanometer thick silicon nitride layer. Layer 19 can be deposited by chemical vapor deposition (CVD). A conventional lithographic step can be utilized to form photoresist feature 23 above layer 19. Feature 23 corresponds to the width of gate structure 18 or aperture 78 (FIG. 1) and can be approximately 50–300 nanometers. Conventional lithography can be utilized to form feature 23.

Figure 3:
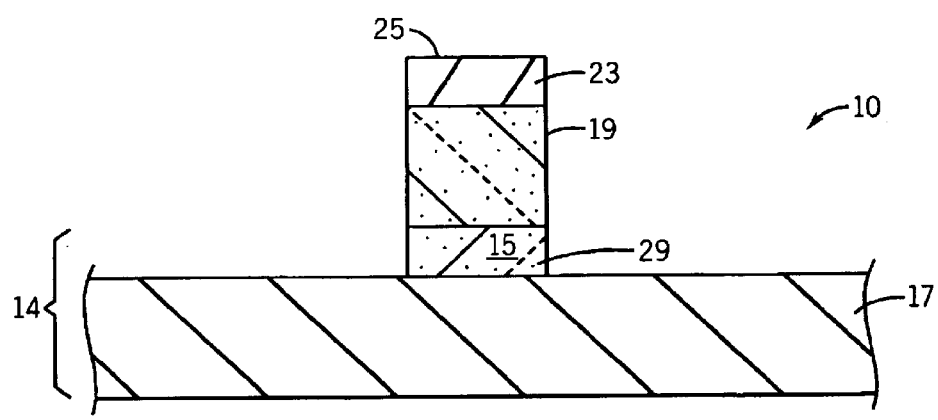
FIG. 3 is a schematic cross-sectional view of the portion of the integrated circuit illustrated in FIG. 1, showing a sacrificial gate conductor formation step.

In FIG. 3, layer 19 is etched in accordance with feature 23 to form a sacrificial gate structure or mask structure 25. Layer 19 can be etched by plasma dry etching. The etching can be performed anisotropically.

Figure 4:
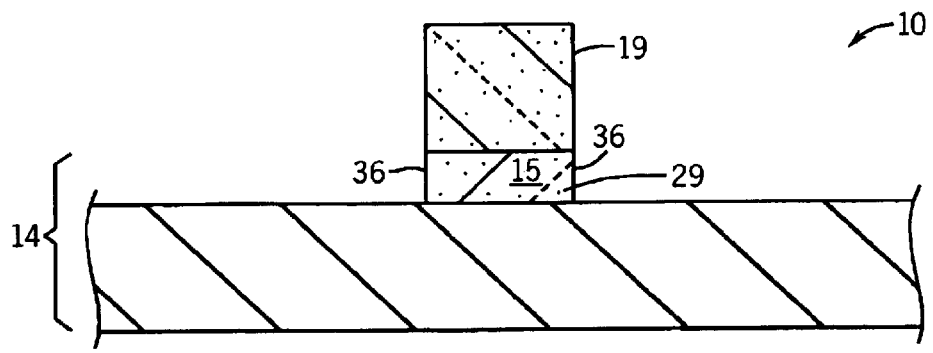
FIG. 4 is a schematic cross-sectional view of the portion of the integrated circuit illustrated in FIG. 1, showing a photoresist stripping step.

After etching layer 19, layer 15 can be etched by plasma dry etching. Etching layer 15 provides a thin film semiconductor island 29 between structure 25 and layer 17. In FIG. 4, a conventional stripping process is utilized to remove feature 23 from structure 25.

Figure 5:
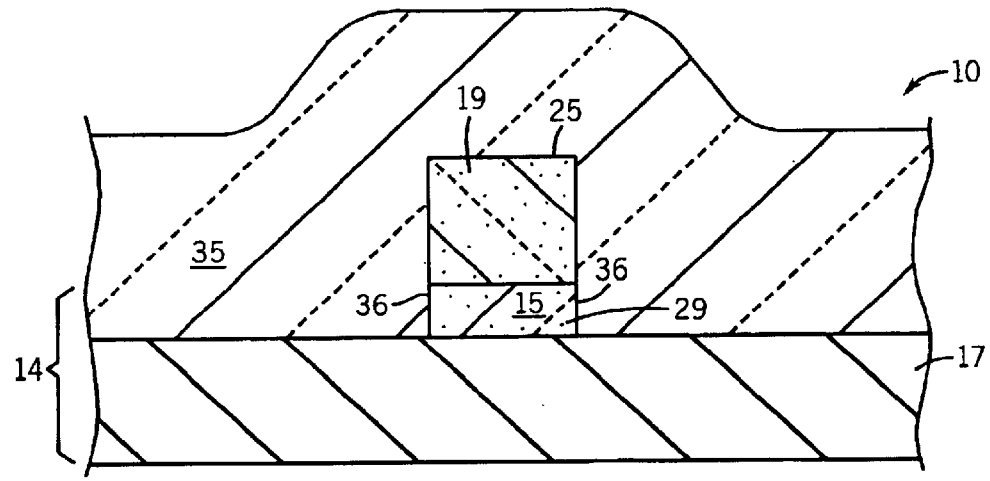
FIG. 5 is a schematic cross-sectional view of the portion of the integrated circuit illustrated in FIG. 1, showing an amorphous semiconductor deposition step.

In FIG. 5, a semiconductor material 35 is deposited above layer 17 and structure 25. Semiconductor material 35 can be a 2000–5000 Å thick film of the same material as layer 15 (e.g., silicon). Alternatively, layer 35 can be or include other semiconductor materials, such as, germanium. Layer 35 can be deposited by low pressure CVD (LPCVD) at temperatures of less than 450° C. (e.g., 400–450° C.).

Layer 35 is utilized to form elevated source region 22 and elevated drain region 24 (FIG. 1). Layer 35 is preferably an undoped amorphous material, such as, amorphous silicon. According to one alternative embodiment, layer 35 can be an in-situ doped semiconductor material.

Figure 6:
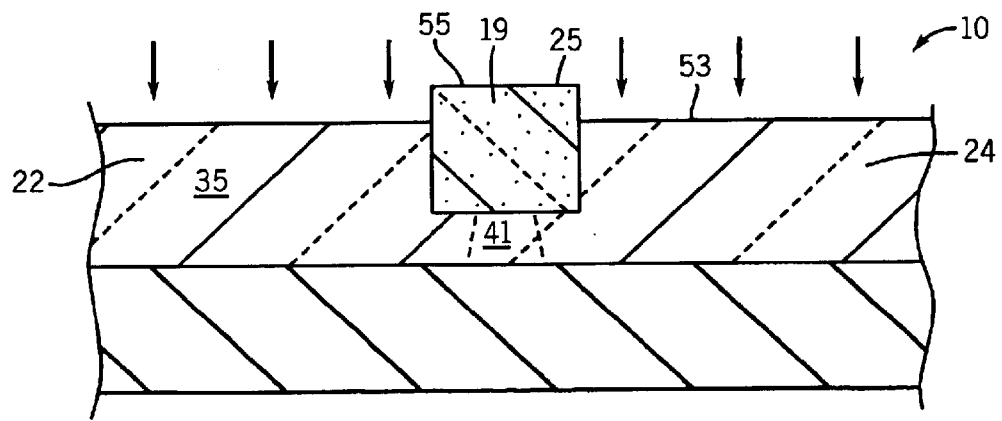
FIG. 6 is a schematic cross-sectional view of the portion of the integrated circuit illustrated in FIG. 1, showing an anisotropic etching step and a source/drain implant step.

In FIG. 6, after layer 35 is deposited, layer 35 is planarized by, for example, a chemical mechanical polish (CMP). The CMP step removes layer 35 to expose mask structure 25 (e.g., layer 19 above island 29). After mask structure 25 is exposed, a removal process is utilized so that a top surface 53 of layer 35 is lower than a top surface 55 of mask structure 25. A CMP process is utilized to expose structure 25 or a separate etching technique can be utilized to lower layer 35. The lowering of layer 35 prevents bridging during subsequent silicidation steps described below with reference to FIG. 1.

After layer 35 is polished, layer 35 is subject to a source/drain implant. Preferably, N-type or P-type dopants are provided by ion implantation to a depth of 300–800 Å below surface 53. The dopants can be implanted in a conventional ion implantation technique utilizing implantation devices manufactured by companies, such as, Varion Company of Palo Alto, Calif., Genius Company, and Applied Materials, Inc. Preferably, the dopants are implanted as ions at 10–100 keV at a dose of $1\times10^{15}$–$6\times10$ dopants per square centimeter.

Channel region 41 is protected by mask structure 25 during the dopant implant. Layer 35 is doped utilizing non-neutral dopants, such as, phosphorous (P), boron (B), arsenic (As), antimony (Sb), indium (In), or gallium (Ga).

After dopants are implanted into layer 35, layer 35 is crystallized. Preferably, layer 35 is crystallized to form a single crystal material, such as, single crystal silicon. Layer 35 can be crystallized in an annealing process to change the structure of layer 35 from an amorphous state to a single crystalline state (e.g., by melting layer 35 which subsequently recrystallizes). Preferably, a solid phase epitaxy technique is utilized to crystallize layer 35. Recrystallization of layer 35 provides an elevated source region 22 and drain region 24. Gate structure 18 (see FIG. 1) is advantageously self-aligned to source region 22 and drain region 24.

Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystalline semiconductor (silicon, silicon/germanium, or germanium) start layer. In FIG. 6, sidewalls 36 (FIG. 5) of feature 29 of layer 15 provide the start layer for recrystallization.

Solid phase epitaxy is usually achieved by heating the amorphous semiconductor. Preferably, a low temperature (e.g., 600–650° C.) thermal anneal is utilized. Alternatively, a rapid thermal anneal (RTA) or a laser anneal can be utilized.

In one embodiment, the annealing process is an excimer laser process (e.g., 308 nm wavelength) for a pulse duration of several nanoseconds. The annealing technique using an excimer laser can raise the temperature of layer 35 to the melting temperature of layer 35 (1100° C.) for silicon or germanium. The melting temperature of layer 35 in the amorphous state is significantly lower than that of layer 15, which is in the crystalline state. For example, the melting temperature of amorphous silicon is 1100° C., and the melting temperature of a single crystal silicon substrate, such as, layer 15 (e.g., C—Si) is 1400° C. Preferably, the annealing process is controlled so that layer 35 is fully melted and layer 15 is not melted. After the energy associated with the annealing process is removed, layer 35 is recrystallized as a single crystal material.

Figure 7:
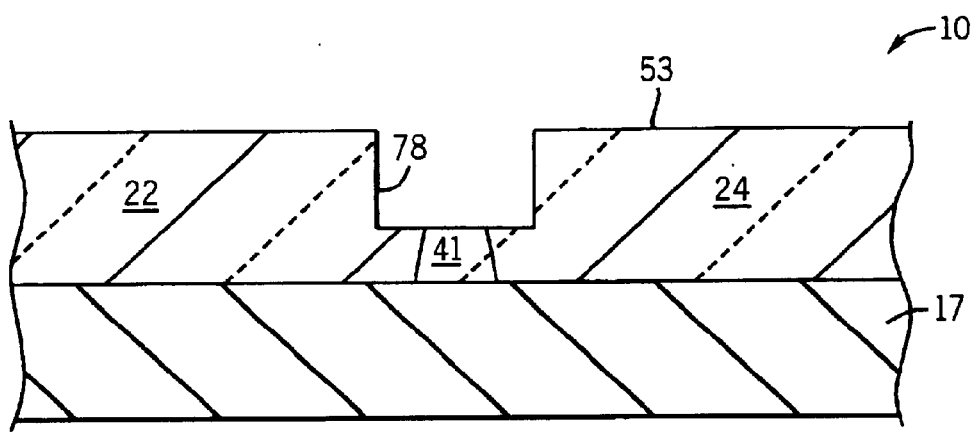
FIG. 7 is a schematic cross-sectional view of the portion of the integrated circuit illustrated in FIG. 1, showing a crystallization step and removal step.
Figure 8:
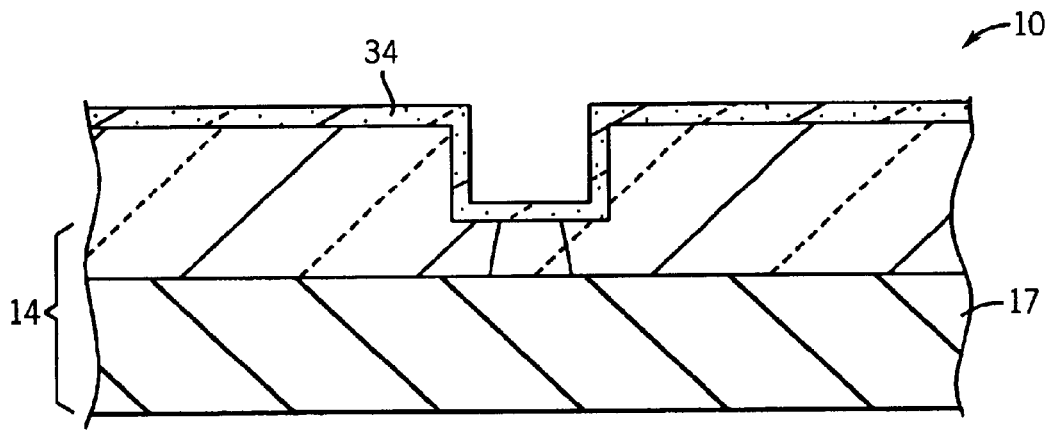
FIG. 8 is a schematic cross-sectional view of the portion of the integrated circuit illustrated in FIG. 1, showing a gate dielectric deposition step.

With reference to FIG. 7, feature 25 (e.g., layer 25) is removed from portion 10 to leave an aperture 78 defined by layer 53, source region 22, drain region 24 and channel region 41. Aperture 78 is preferably 50–300 nanometers thick (e.g., the same thickness as feature 25). Feature 25 can be removed in a wet chemical etch process. Alternatively, removal processes including dry etching, plasma dry etching, etc., can be utilized depending on materials associated with portion 10.

After aperture 78 is formed, dielectric layer 34 is deposited in aperture 78 and on top surface 53 of layer 35. Layer 34 prevents bridging between layer 56 and gate conductor 36 (FIG. 1). Layer 34 can be conformally deposited as a 50–200 Å thick silicon nitride layer by CVD.

Alternatively, layer 34 can be a high-k gate dielectric formed according to the process of U.S. Pat. No. 6,100,120. For example, layer 34 can be deposited as a metal and thereafter oxidized to form layer 34. In another alternative, layer 34 can be deposited by sputtering or by metal organic CVD.

Figure 9:
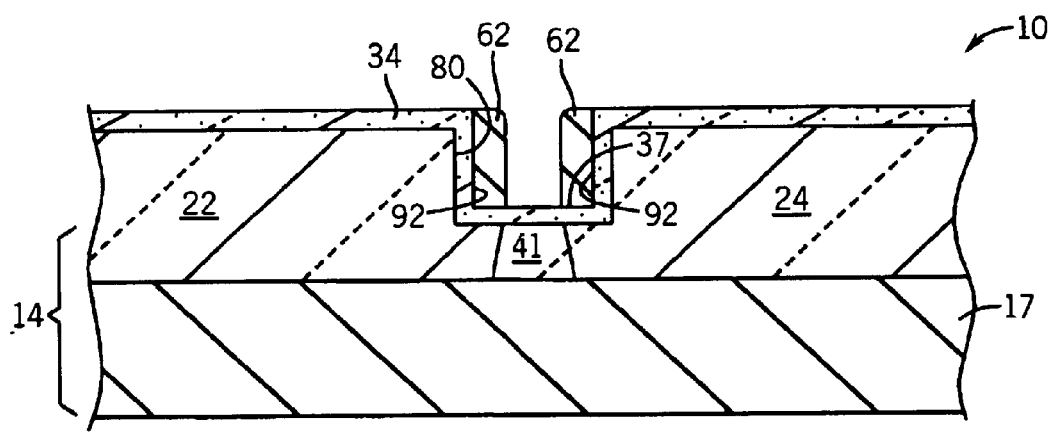
FIG. 9 is a cross-sectional view of the portion of the integrated circuit illustrated in FIG. 1, showing a spacer formation step.

In FIG. 9, portion 10 is subjected to a spacer formation process which creates spacers 62 on sidewalls 92 of dielectric layer 34. Dielectric layer 34 defines an aperture 80. Preferably, spacers 62 are narrow and are formed in a low temperature process. Spacers 62 are preferably 100–1000 Å wide (e.g., left to right) and 500–2000 Å thick (e.g., top (from a top surface of layer 34) to bottom (to top surface 37)). Spacers 62 are silicon nitride and are formed in a conventional deposition and etch-back process.

Figure 10:
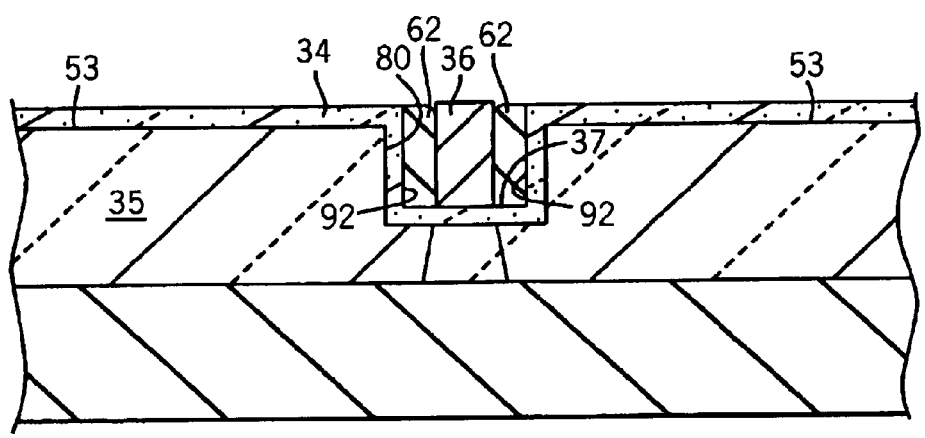
FIG. 10 is a cross-sectional view of the portion of the integrated circuit illustrated in FIG. 1, showing a gate conductor formation step.

In FIG. 10, after spacers 62 are formed, gate conductor 36 is provided between spacers 62. Gate conductor 36 is preferably 200–2000 Å wide and 500–2000 Å high. Gate conductor 36 can be a metal gate electrode or other conductive material. For example, gate conductor 36 can be a titanium nitride material, tungsten material, molybdenum material, aluminum material, or other metal. Alternatively, gate conductor 36 can be a doped polysilicon material or other semiconductive material. Conductor 36 is preferably provided between spacers 62 by a conformal deposition followed by an etch or polish.

In FIG. 1, layer 56 is formed above regions 22 and 24. Layer 56 can be formed in a self-aligned silicide process. The process is preferably a cobalt silicide process having an anneal temperature of 800–825° C. Layer 34 is removed from surface 53 of layer 35. Layer 34 is removed from above regions 22 and 24 to allow electrical contact to regions 22 and 24. Layer 34 can be selectively removed in a lithographic process by dry etching.

After layer 34 is removed, layer 56 is formed above regions 22 and 24. According to one embodiment, a layer of cobalt is deposited by sputter deposition over regions 22 and 24. After deposition, the layer of cobalt is heated to react with substrate 14 and form layer 56. Layer 56 is preferably 100–500 Å thick and consumes 30 percent of its thickness from substrate 14. High temperature processes can be utilized for layer 56 because dielectric layer 34 has not yet been formed. Alternatively, layer 56 can be a titanium silicide, nickel silicide, tungsten silicide or other material.

After layer 56 is formed, an insulative layer can be provided above layer 56 in a tetraethylorthosilicate TEOS deposition process. After the insulative layer is deposited and planarized, vias for contacts can be etched. Contacts can be provided to connect layers 56 to conductive lines. Conventional integrated circuit fabrication processes can be utilized to provide various other connections and form other devices as necessary for portion 10 of the integrated circuit.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of structures are shown, other structures can be utilized. Various changes may be made to the details disclosed without departing from the scope of the invention which is defined by the following claims.

What is claimed is:

1. A method of manufacturing an integrated circuit, the integrated circuit including a thin film transistor on a substrate, the substrate including a thin semiconductor layer, the method comprising steps of:

providing a sacrificial gate structure on the thin semiconductor layer of the substrate;

etching the thin semiconductor layer in accordance with the sacrificial gate structure;

providing an amorphous semiconductor layer above the substrate and over the gate structure;

removing a portion of the amorphous semiconductor layer to expose the sacrificial gate structure;

forming a single crystalline semiconductor material from the amorphous semiconductor material;

siliciding the single crystalline material;

removing the sacrificial gate structure to form an aperture; and providing a gate conductor in the aperture.

2. The method of claim 1, further comprising:

providing a spacer in the aperture before providing the gate conductor.

3. The method of claim 2, further comprising:

providing a gate dielectric in the aperture before providing the spacer and above the amorphous semiconductor layer.

4. The method of claim 3, wherein the siliciding step is a colbalt silicide process.

5. The method of claim 1, wherein the sacrificial gate structure includes silicon nitride.

6. The method of claim 1, wherein the amorphous semiconductor layer is an in-situ doped layer.

7. The method of claim 6, wherein the amorphous semiconductor material includes silicon.

8. The method of claim 1, wherein the substrate includes single crystalline silicon.

9. The method of claim 1, wherein the amorphous semiconductor layer includes silicon germanium.

10. A method of manufacturing an ultra-large scale integrated circuit including a transistor, the method comprising:

providing a gate mask structure on a top surface of a thin film, the thin film being above a base layer;

etching the thin film in accordance with the gate mask structure;

depositing an amorphous semiconductor material above a top surface of the base layer and the mask structure;

a removing the semiconductor material to a level below a top surface of the mask structure;

crystalizing the amorphous semiconductor material;

siliciding the semiconductor material;

removing the mask structure to leave an aperture; and providing a gate conductor in the aperture.

11. The method of claim 10, further comprising:

providing an insulative layer over the silicided semiconductor material before the gate structure is provided.

12. The method of claim 11, further comprising:

providing a source and drain dopant implant before the insulative layer is provided.

13. The method of claim 12, further comprising: providing a high-k gate dielectric in the aperture.

14. The method of claim 13, wherein the siliciding is performed at a temperature of more than 800° C.

15. The method of claim 11, wherein the insulative layer has a top surface co-planer with a top surface of the mask structure.

16. The method of claim 10, wherein the mask structure is a sacrificial nitride gate structure.

17. A process of manufacturing transistor including a thin film, a gate structure having a gate dielectric above the thin film and a gate conductor above a portion of the gate dielectric, source and drain regions adjacent the gate structure, and a silicide layer having a top surface above a bottom surface of the gate conductor and below a top surface of the gate conductor, the gate dielectric being at least partially above the top surface of the suicide layer, the process comprising:

providing a mask structure on a top surface of the thin film, the thin film being above a base layer;

etching the thin film in accordance with the mask structure;

depositing an amorphous semiconductor material above the top surface of the base layer and the mask structure;

removing the amorphous semiconductor material to a level below a top surface of the mask structure;

crystalizing the amorphous semiconductor material;

siliciding the crystallized semiconductor material to form the silicide layer;

removing the mask structure to leave an aperture; and providing the gate conductor in the aperture.

18. The process of claim 17, wherein the gate dielectric is U-shaped.

19. The process of claim 17, wherein the gate structure includes spacers.

20. The process of claim 19, wherein the spacers are disposed between a portion of the gate dielectric and the silicide layer.

* * * * *

UNITED STATES PATENT AND TRADEMARK OFFICE
CERTIFICATE OF CORRECTION

PATENT NO. : 6,787,424 B1
DATED : September 7, 2004
INVENTOR(S) : Bin Yu

It is certified that error appears in the above-identified patent and that said Letters Patent is hereby corrected as shown below:

Column 9,
Line 36, delete "a" before the word "removing"

Column 10,
Line 20, delete "suicide" and replace with -- silicide --

Signed and Sealed this

Ninth Day of November, 2004

JON W. DUDAS
*Director of the United States Patent and Trademark Office*